United States Patent
Oh

(10) Patent No.: US 10,075,663 B2
(45) Date of Patent: Sep. 11, 2018

(54) PHASE DETECTION PIXELS WITH HIGH SPEED READOUT

(71) Applicant: SEMICONDUCTOR COMPONENTS INDUSTRIES, LLC, Phoenix, AZ (US)

(72) Inventor: Minseok Oh, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/410,937

(22) Filed: Jan. 20, 2017

(65) Prior Publication Data

US 2018/0213173 A1 Jul. 26, 2018

(51) Int. Cl.
*H04N 5/378* (2011.01)
*H04N 5/359* (2011.01)
*H01L 27/146* (2006.01)
*H04N 5/225* (2006.01)

(52) U.S. Cl.
CPC ....... *H04N 5/378* (2013.01); *H01L 27/14621* (2013.01); *H01L 27/14627* (2013.01); *H01L 27/14634* (2013.01); *H01L 27/14636* (2013.01); *H01L 27/14645* (2013.01); *H01L 27/14649* (2013.01); *H01L 27/14654* (2013.01); *H04N 5/2254* (2013.01); *H04N 5/359* (2013.01)

(58) Field of Classification Search
CPC ...... H04N 5/378; H04N 5/2254; H04N 5/359; H01L 27/14649; H01L 27/14621; H01L 27/14645
See application file for complete search history.

(56) References Cited

U.S. PATENT DOCUMENTS

| | | | | |
|---|---|---|---|---|
| 2006/0208291 A1* | 9/2006 | Koizumi | ........... | H01L 27/14603 257/292 |
| 2006/0221667 A1* | 10/2006 | Ogura | ............... | H01L 27/14625 365/149 |
| 2007/0069258 A1* | 3/2007 | Ahn | .................. | H01L 27/14634 257/290 |
| 2007/0131991 A1* | 6/2007 | Sugawa | ........... | H01L 27/14603 257/292 |
| 2008/0266434 A1* | 10/2008 | Sugawa | ........... | H01L 27/14609 348/308 |
| 2009/0021625 A1* | 1/2009 | Sowa | ................... | H04N 5/3742 348/308 |
| 2010/0020209 A1 | 1/2010 | Kim | | |
| 2012/0175498 A1* | 7/2012 | Krymski | ........... | H01L 27/14609 250/208.1 |
| 2012/0268566 A1 | 10/2012 | Kim | | |

(Continued)

*Primary Examiner* — Abdelaaziz Tissire

(74) *Attorney, Agent, or Firm* — Treyz Law Group, P.C.; Joseph F. Guihan

(57) ABSTRACT

Phase detection pixel pairs may include first and second photodiodes covered by a single microlens. To decrease the readout time of the phase detection pixels, each phase detection pixel may have a respective floating diffusion region. Each phase detection pixel may include a transfer gate that can be asserted to transfer charge from the photodiode to the floating diffusion region. During readout, charge from each photodiode in the phase detection pixel pair may be read out in parallel. The phase detection pixel pairs may be implemented in multiple substrates connected by interconnect layers.

14 Claims, 11 Drawing Sheets

(56) References Cited

U.S. PATENT DOCUMENTS

| | | |
|---|---|---|
| 2012/0307030 A1* | 12/2012 | Blanquart .......... H01L 27/14601 348/76 |
| 2013/0062500 A1 | 3/2013 | Oh et al. |
| 2013/0087875 A1* | 4/2013 | Kobayashi .......... H01L 27/1461 257/432 |
| 2013/0092820 A1* | 4/2013 | Takemoto .............. H04N 5/369 250/208.1 |
| 2013/0126710 A1* | 5/2013 | Kondo .............. H01L 27/14609 250/208.1 |
| 2013/0175652 A1* | 7/2013 | Yamazaki .......... H01L 27/14607 257/435 |
| 2013/0182173 A1 | 7/2013 | Murata |
| 2013/0214128 A1* | 8/2013 | Yamashita .......... H01L 27/14609 250/208.1 |
| 2013/0222552 A1* | 8/2013 | Agranov ............ H04N 13/0203 348/49 |
| 2013/0229560 A1* | 9/2013 | Kondo .................. H04N 5/374 348/308 |
| 2013/0234029 A1 | 9/2013 | Bikumandla |
| 2014/0002636 A1 | 1/2014 | Lee et al. |
| 2015/0053846 A1 | 2/2015 | Byun |
| 2016/0105624 A1* | 4/2016 | Handa .............. H01L 27/14603 348/303 |
| 2016/0198110 A1* | 7/2016 | Ikedo .................. H04N 5/378 348/231.99 |
| 2016/0198141 A1* | 7/2016 | Fettig .................. H04N 5/3698 348/46 |
| 2016/0219237 A1* | 7/2016 | Kobayashi ............. H04N 5/378 |

* cited by examiner

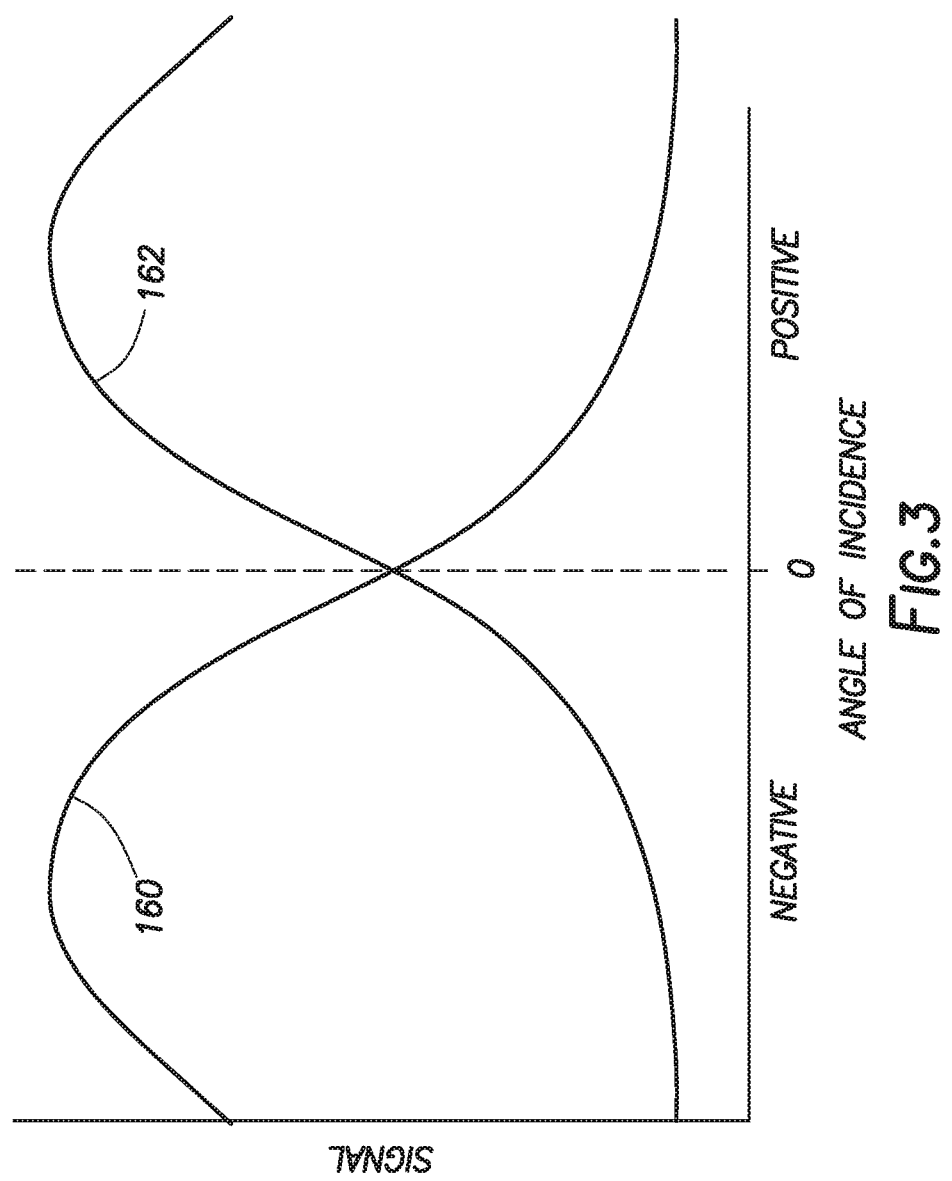

PHASE DETECTION PIXELS WITH HIGH SPEED READOUT

BACKGROUND

This relates generally to imaging systems and, more particularly, to imaging systems with phase detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Yet another arrangement for electronic devices to identify distances includes using phase detection pixels. However, conventional phase detection pixels may have limited dynamic range and undesirably slow readout times.

It would therefore be desirable to be able to provide improved phase detection pixel arrangements for image sensors.

BRIEF DESCRIPTION OF THE DRAWINGS

FIG. 3 is a diagram of illustrative signal outputs of phase detection pixels for incident light striking the phase detection pixels at varying angles of incidence in accordance with an embodiment of the present invention.

DETAILED DESCRIPTION

Figure 1:
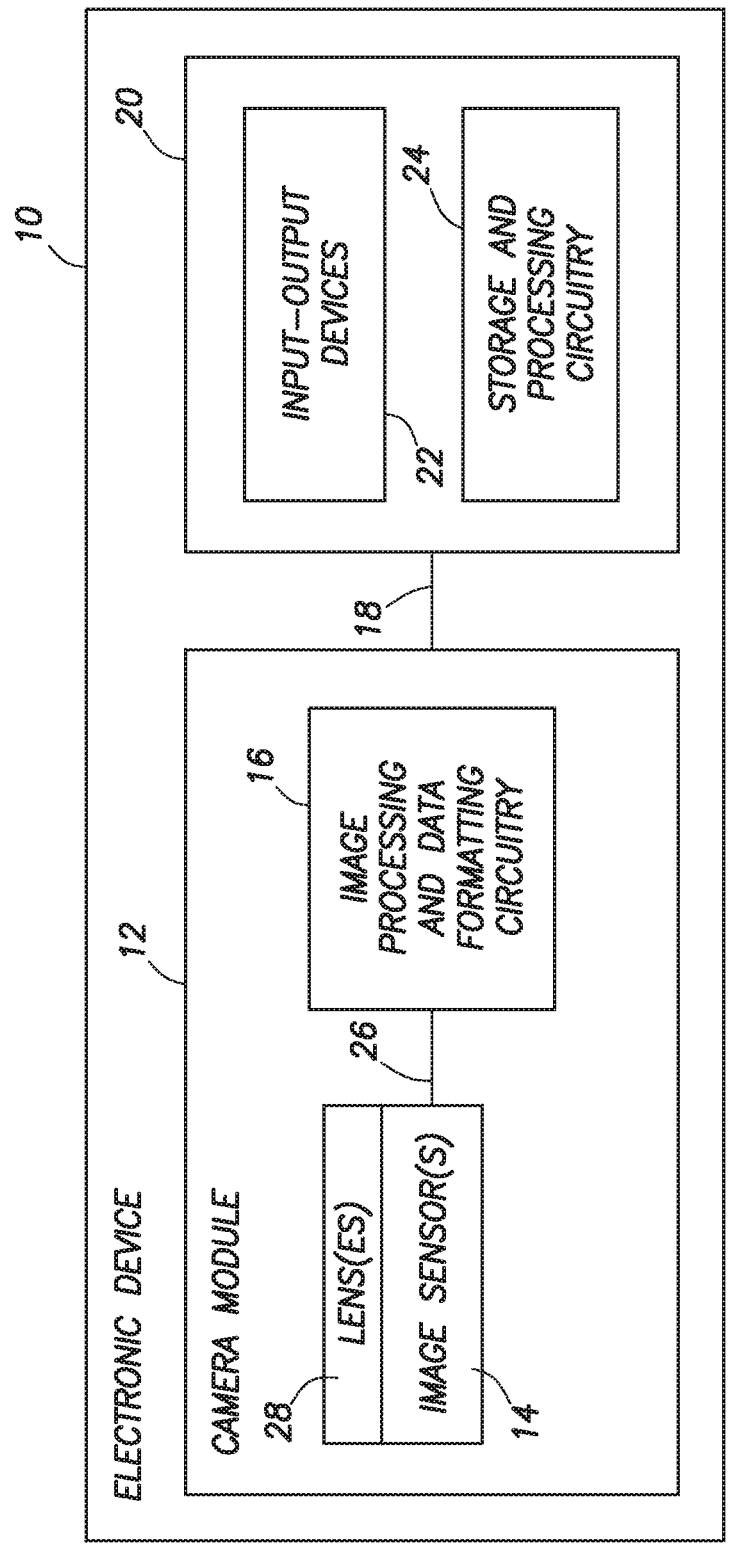
FIG. 1 is a schematic diagram of an illustrative electronic device with an image sensor that may include phase detection pixels in accordance with an embodiment of the present invention.

Embodiments of the present invention relate to image sensors with automatic focusing and depth sensing capabilities. An electronic device with a camera module is shown in FIG. 1. Electronic device 10 may be a digital camera, a computer, a cellular telephone, a medical device, or other electronic device. Camera module 12 (sometimes referred to as an imaging device) may include one or more image sensors 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. For example, camera sensor 14 and image processing and data formatting circuitry 16 may be formed using separate integrated circuits that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel groups such as pixel pair 100 shown in FIG. 2A.

Figure 2A:
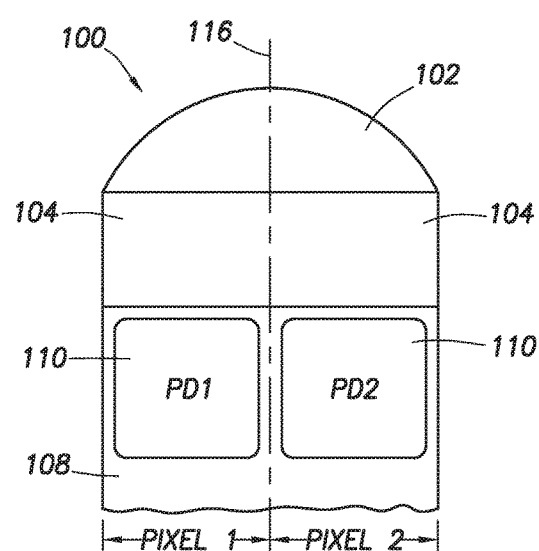
FIG. 2A is a cross-sectional view of illustrative phase detection pixels having photosensitive regions with different and asymmetric angular responses in accordance with an embodiment of the present invention.

FIG. 2A is an illustrative cross-sectional view of pixel pair 100. Pixel pair 100 may include first and second pixels such as Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. Microlens 102 may have a width and a length, with the length being longer than the width. Microlens 102 may have a length that is about twice as long as its width. Microlens 102 may be in the shape of an ellipse with an aspect ratio of about 2:1. In other embodiments, microlens 102 may be another shape such as a rectangle or another desired shape. Microlens 102 may have an aspect ratio of less than 2:1, 2:1, greater than 2:1, between 1.5:1 and 2.5:1, greater than 3:1, or any other desired aspect ratio.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the certain ranges of wavelengths). Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

Figures 2B, 2C:
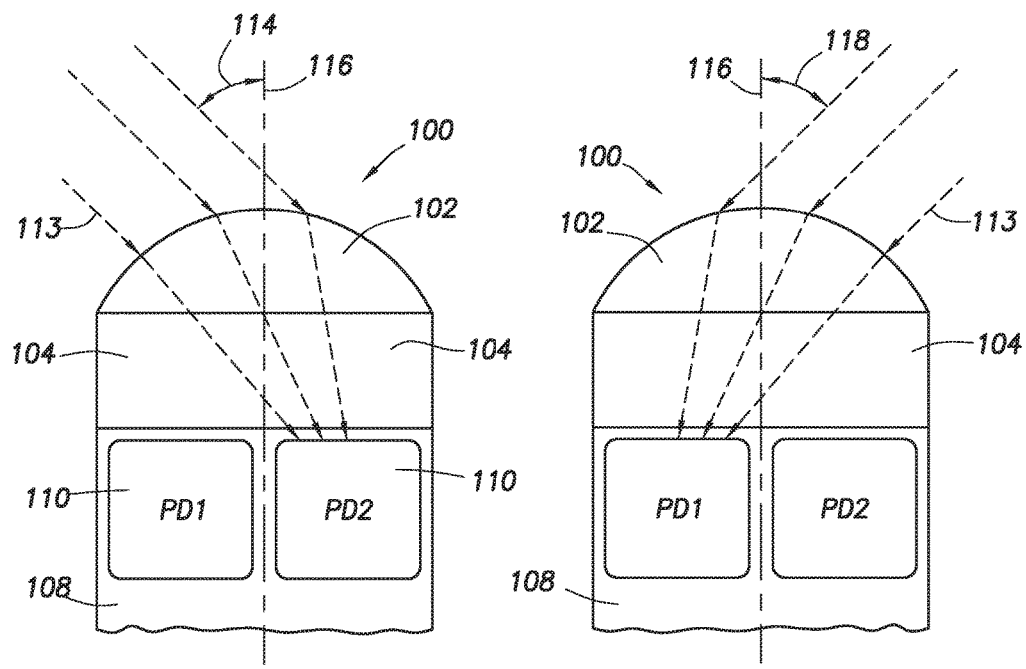
FIGS. 2B and 2C are cross-sectional views of the phase detection pixels of FIG. 2A in accordance with an embodiment of the present invention.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the pixel signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in camera module 12 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel groups that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

Figure 4:
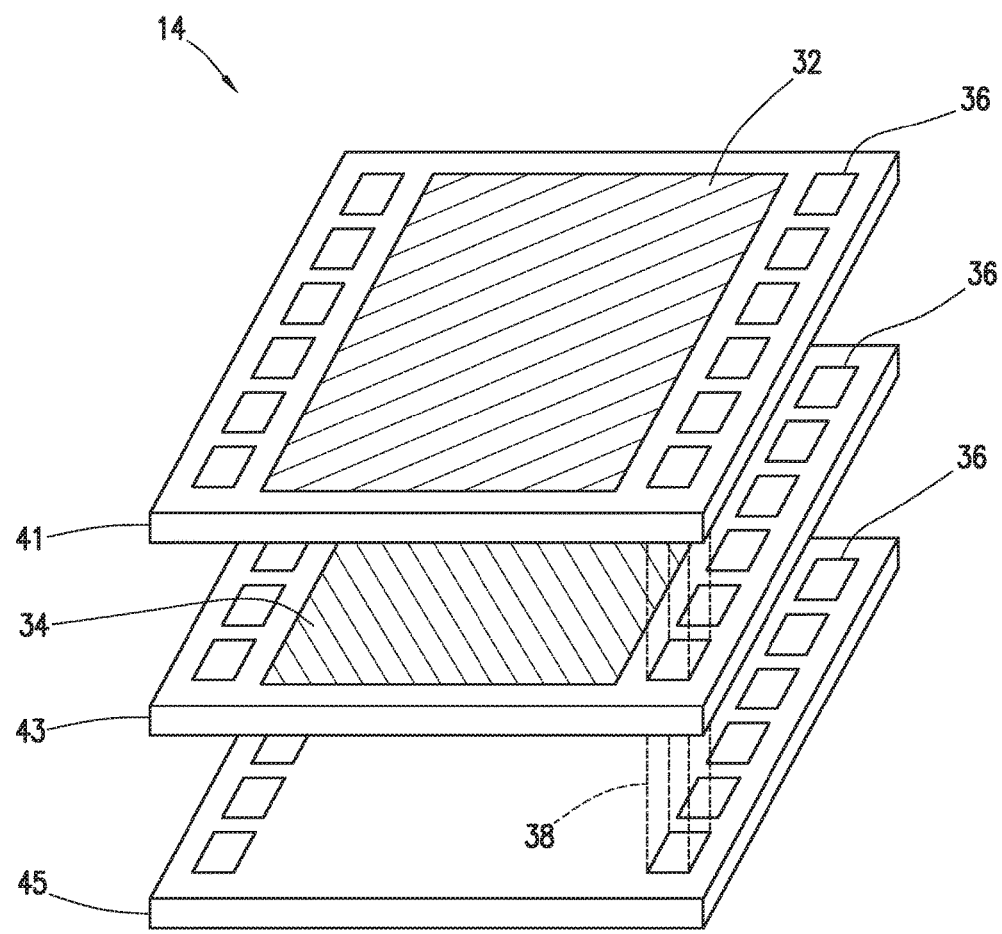
FIG. 4 is a perspective view of an image sensor with multiple substrates bonded together in accordance with an embodiment of the present invention.

FIG. 4 shows an illustrative image sensor such as image sensor 14 in FIG. 1. Image sensor 14 may sense light by converting impinging photons into electrons or holes that are integrated (collected) in sensor pixels. After completion of the integration cycle, collected charge may be converted into a voltage, which may be supplied to the output terminals of image sensor 14. In embodiments where image sensor 14 is a complementary metal-oxide semiconductor (CMOS) image sensor, the charge to voltage conversion may be accomplished directly in the pixels of the image sensor. The analog pixel voltage may then be transferred to the output terminals through various pixel addressing and scanning schemes. The analog signal may also be converted on-chip to a digital equivalent before reaching the chip output. The pixels may have a source follower (SF), which may drive the sense lines that are connected to the pixels using suitable addressing transistors.

After charge to voltage conversion is completed and the resulting signal transferred out from the pixels, the pixels of image sensor 14 may be reset in order to be ready to accumulate new charge. In certain embodiments, pixels may use a floating diffusion region (FD) as a charge detection node. When a floating diffusion node is used, the reset may be accomplished by turning on a reset transistor that conductively connects the FD node to a voltage reference, which may be the pixel SF drain node. This step removes collected charge from the floating diffusion node. However, it may generate kTC-reset noise. This kTC-reset noise may be removed from the signal using a Correlated Double Sampling (CDS) signal processing technique in order to achieve low noise performance.

Image sensor 14 may be formed with one or more substrate layers. The substrate layers may be layers of semiconductor material such as silicon. The substrate layers may be connected using metal interconnects. An example is shown in FIG. 4 in which substrates 41, 43, and 45 are used to form image sensor 14. Substrates 41, 43 and 45 may sometimes be referred to as chips. Upper chip 41 may contain the pinned photodiodes in pixel array 32. Charge transferring transistor gates may also be included in upper chip 41. However, to ensure that there is adequate room for the photodiodes in upper chip 41, much of the pixel circuitry for the pixels may be formed in middle chip 43 and lower chip 45.

Middle chip 43 may be bonded to upper chip 41 with an interconnect layer at every pixel. For example, pixel circuitry 34 in middle chip 43 may be bonded to a Floating Diffusion (FD) that is connected to a charge transfer transistor formed in upper chip 41. Bonding each pixel in upper chip 41 to corresponding pixel circuitry in middle chip 43 (e.g., floating diffusion to floating diffusion) may be referred to as hybrid bonding. Middle chip 43 and lower chip 45 may not be coupled with hybrid bonding. Only peripheral electrical contact pads 36 of each chip may be bonded together (e.g., chip-to-chip connections 38). Each chip in image sensor 14 may include relevant circuitry. The upper chip may contain pinned photodiodes and charge transferring transistor gates. The middle chip may include pixel circuitry (e.g., floating diffusion node, source follower transistor, reset transistor etc.). The bottom chip may include one or more of clock generating circuits, pixel addressing circuits, signal processing circuits such as the CDS circuits, analog to digital converter circuits, digital image processing circuits, and system interface circuits. These examples are merely illustrative and each chip may include any desired circuitry.

Figure 5:
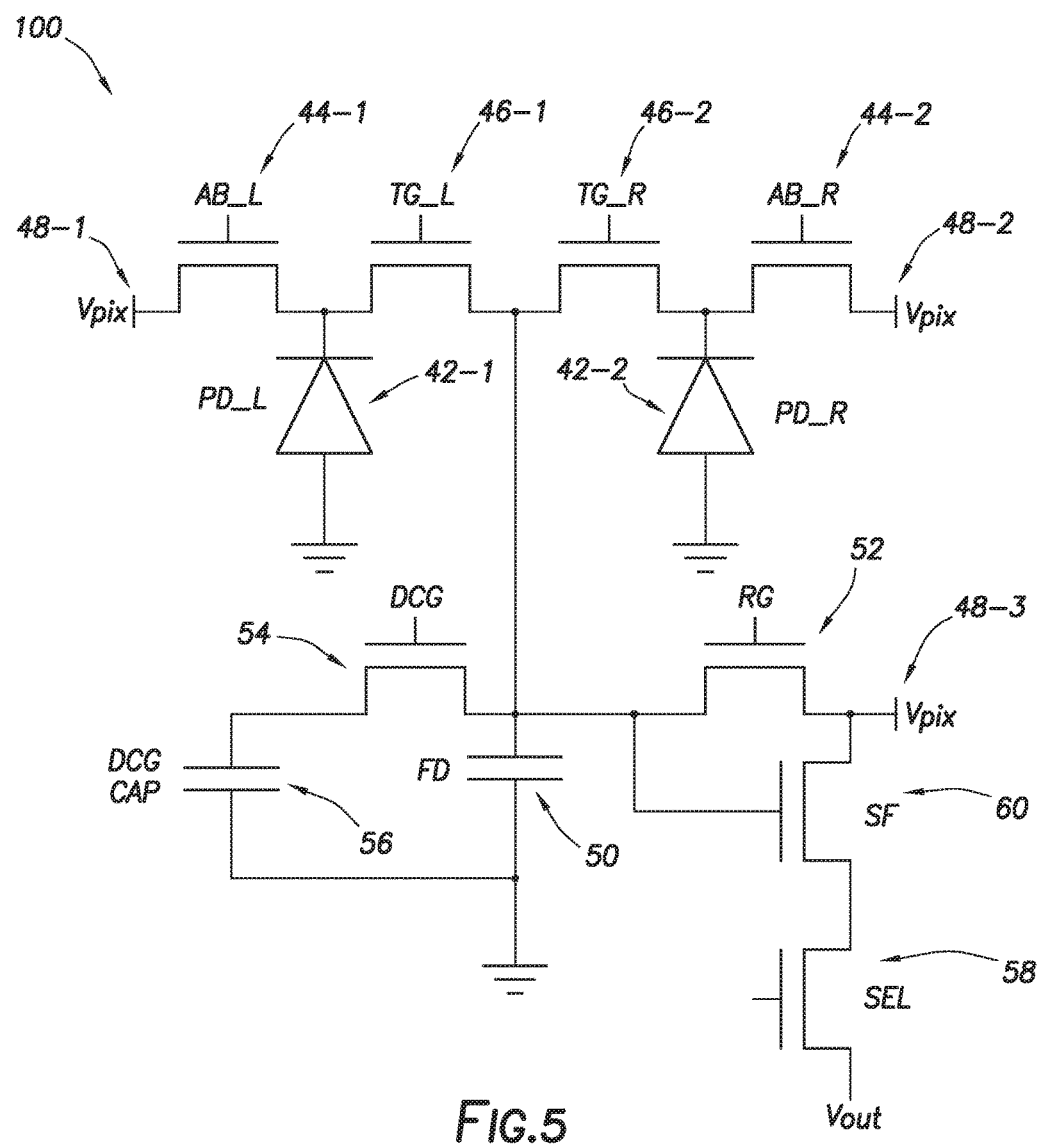
FIG. 5 is a circuit diagram of an illustrative phase detection pixel pair with a shared floating diffusion region in accordance with an embodiment of the present invention.

FIG. 5 is a circuit diagram of an illustrative phase detection pixel pair 100. As shown in FIG. 5, phase detection pixel pair 100 may include two photodiodes that share readout circuitry. The first photodiode 42-1 may sometimes be referred to as the left photodiode (PD_L). The second photodiode 42-2 may sometimes be referred to as the right photodiode (PD_R). Each photodiode may be coupled to a respective transfer gate and anti-blooming gate. Photodiode 42-1 may be selectively coupled to bias voltage supply terminal 48-1 by anti-blooming transistor 44-1. When the anti-blooming transistor 44-1 (AB_L) is asserted, photodiode 42-1 may be coupled to bias voltage supply terminal 48-1, preventing charge from accumulating in the photodiode. Bias voltage supply terminal 48-1 may provide any desired bias voltage ($V_{pix}$). Transfer transistor 46-1 (TG_L) may couple photodiode 42-1 to floating diffusion region 50. When transfer transistor 46-1 is asserted, charge from photodiode 42-1 may be transferred to the floating diffusion region.

Photodiode 42-2 may be selectively coupled to bias voltage supply terminal 48-2 by anti-blooming transistor 44-2. When the anti-blooming transistor 44-2 (AB_R) is asserted, photodiode 42-2 may be coupled to bias voltage supply terminal 48-2, preventing charge from accumulating in the photodiode. Bias voltage supply terminal 48-2 may provide any desired bias voltage ($V_{pix}$). Transfer transistor 46-2 (TG_R) may couple photodiode 42-2 to floating diffusion region 50. When transfer transistor 46-2 is asserted, charge from photodiode 42-2 may be transferred to the floating diffusion region.

Floating diffusion region 50 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiodes 42-1 and 42-2. Floating diffusion region 50 may be coupled to bias voltage supply terminal 48-3 by reset transistor 52.

Dual conversion gain transistor 54 may have a gate terminal that is controlled using dual conversion gain signal DCG. The phase detection pixels may be operable in a high conversion gain mode and in a low conversion gain mode. If transistor 54 is disabled (e.g., if signal DCG is low), the pixels are placed in the high conversion gain mode. If transistor 54 is enabled (e.g., if signal DCG is high), the pixels are placed in the low conversion gain mode.

In general, pixel conversion gain is inversely proportional to the amount of loading capacitance at the floating diffusion node FD. When transistor 54 is turned on, dual conversion gain capacitor 56 (DCG Cap) is switched into use in order to provide shared floating diffusion node 50 with additional capacitance (e.g., additional charge storage capacity). This results in a lower conversion gain for the phase detection pixels. When transistor 54 is turned off, the additional loading of capacitor 56 is removed and the pixels revert to a relatively higher pixel conversion gain configuration. If desired, the pixels may be operated in high conversion gain mode (e.g., transistor 54 may be turned off) when operating in a high resolution mode and may be operated in low conversion gain mode (e.g., transistor 54 may be turned on) when operating in a low resolution mode.

The signal associated with the stored charge on floating diffusion node 50 is conveyed to row select transistor 58 (SEL) by source-follower transistor 60 (SF). When operating the pixels of phase detection pixel pair 100, the reset transistor may be turned on to reset the floating diffusion region 50. After the reset process is complete, transfer gate 46-1 or 46-2 may be turned on. When one of the transfer transistors is turned on, the charge that has been generated by the corresponding photodiode (i.e., 42-1 or 42-2) in response to incoming light is transferred to shared charge storage node 50. Transfer gates 46-1 and 46-2 may be pulsed once to perform one charge transfer operation or may be pulsed multiple times to perform multiple charge transfer operations (e.g., to extend the effective charge well capacity of the corresponding photodiodes). When it is desired to read out the value of the stored charge (i.e., the value of the stored charge that is represented by the signal at the source of transistor 60), row select control signal SEL may be asserted. When signal SEL is asserted, transistor 58 turns on and a corresponding image signal $V_{OUT}$ that is representative of the magnitude of the charge on shared charge storage node 50 (e.g., a reset-level or an image-level voltage from one or more photodiodes) is produced.

Figure 6:
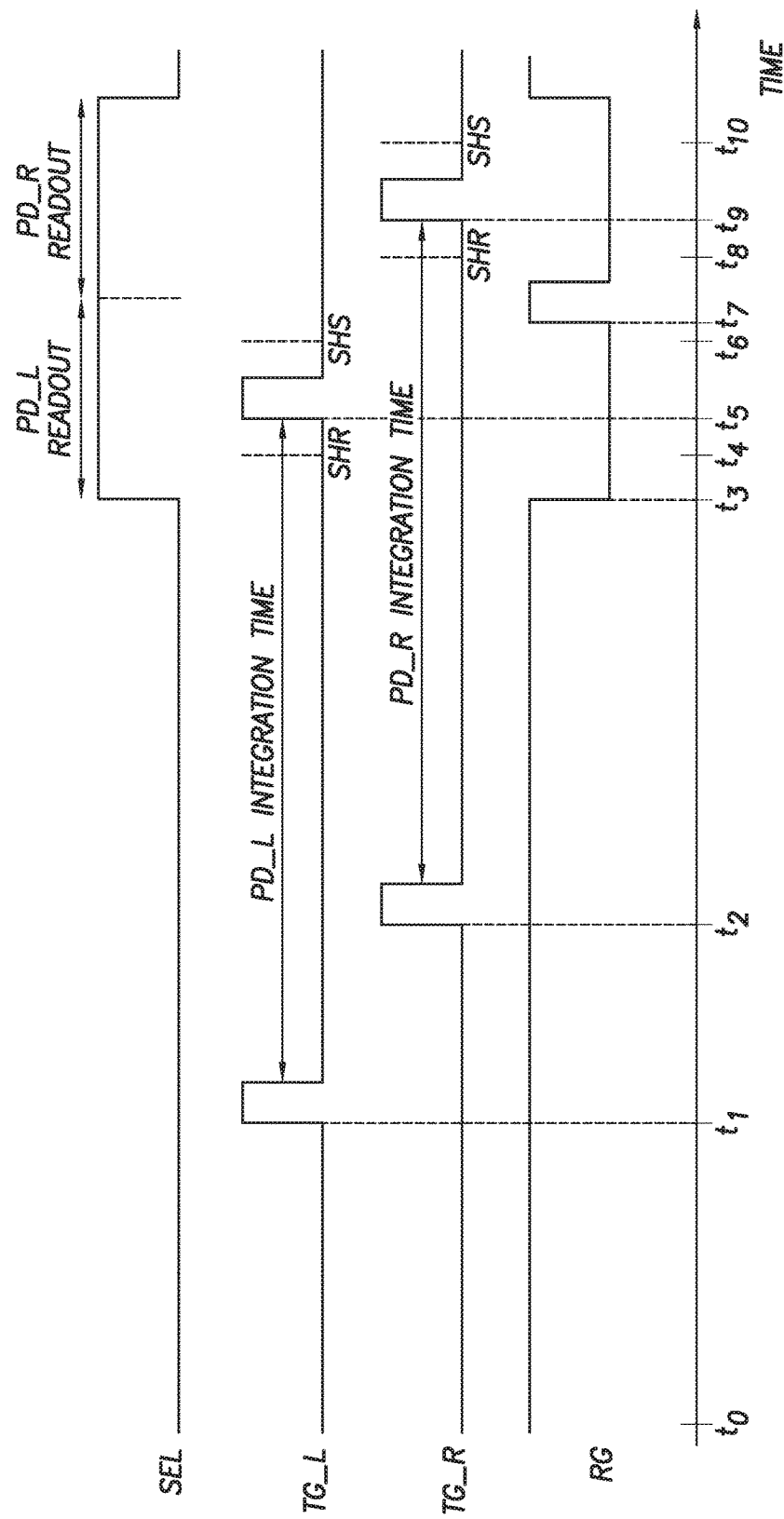
FIG. 6 is a timing diagram showing the operation of the phase detection pixel pair shown in FIG. 5 in accordance with an embodiment of the present invention.

FIG. 6 is a timing diagram showing the operation of phase detection pixel pair 100 from FIG. 5. As shown, at $t_0$ the reset transistor RG may be asserted. Asserting reset transistor RG may reset floating diffusion 50 to a baseline value. At $t_1$, transfer transistor TG_L may be asserted. Asserting transfer transistor TG_L (while reset transfer RG is asserted) may clear any accumulated charge from photodiode 42-1 (PD_L). Similarly, at $t_2$, transfer transistor TG_R may be asserted. Asserting transfer transistor TG_R (while reset transfer RG is asserted) may clear any accumulated charge from photodiode 42-2 (PD_R). After TG_L is asserted at $t_1$, charge may begin accumulating in PD_L during the PD_L integration time. After TG_R is asserted at $t_2$, charge may begin accumulating in PD_R during the PD_R integration time. At $t_3$, the reset transistor may be turned off, the row select transistor may be turned on, and the PD_L readout period may begin. After RG is deasserted, the reset level of the floating diffusion region may be sampled at $t_4$ by asserting the sample and hold reset signal (SHR). Charge from PD_L may subsequently be transferred to floating diffusion region 50 by asserting TG_L at $t_5$. After TG_L is asserted at $t_5$, the amount of charge in the floating diffusion region (i.e., the sample from the integration time) may be sampled by asserting the sample and hold signal (SHS) at $t_6$.

After the charge from PD_L is read out, the PD_R readout may occur. At $t_7$ RG may be asserted to reset floating diffusion region 50 to a baseline level. After RG is deasserted, the reset level of the floating diffusion region may be sampled at $t_8$ by asserting the sample and hold reset signal (SHR). Charge from PD_R may subsequently be transferred to floating diffusion region 50 by asserting TG_R at $t_9$. After TG_R is asserted at $t_9$, the amount of charge in the floating diffusion region (i.e., the sample from the integration time) may be sampled by asserting the sample and hold signal (SHS) at $t_{10}$.

The PD_L integration time may occur between the reset of PD_L and the transfer of charge from PD_L to the floating diffusion region (i.e., between $t_1$ and $t_5$). The PD_R integration time may occur between the reset of PD_R and the transfer of charge from PD_R to the floating diffusion region (i.e., between $t_2$ and $t_7$). In FIG. 6, the floating diffusion region is sampled before and after charge transfer in a correlated double sampling readout. Correlated double sampling (CDS) is used to correct for noise in imaging pixels. Voltage at the floating diffusion region may be sampled to determine the amount of incident light exposure for the imaging pixel. Ideally, all of the voltage at the floating diffusion region would be associated with the incident light. However, in reality, this is not the case and some of the voltage will be present due to noise. In order to isolate the voltage that comes from the incident light, correlated double sampling compares the reset voltage level at the FD to the sample voltage level at the FD. The reset voltage level is the amount of voltage that comes from noise, while the sample voltage level includes voltage from noise and incident light. The reset voltage level may be subtracted from the sample voltage level to isolate the amount of voltage associated with the incident light.

As shown in FIG. 6, because PD_L and PD_R share floating diffusion region 50, readout of PD_L and PD_R must be performed sequentially. In the example of FIG. 6, readout of PD_R cannot begin until readout of PD_L concludes. This undesirably prolongs the length of the readout period (and accordingly, decreases the maximum framerate of the image sensor). In order to shorten the length of the readout period, each photodiode in phase detection pixel pair 100 may have a respective floating diffusion region. An embodiment of this type is shown in FIG. 7.

Figure 7:
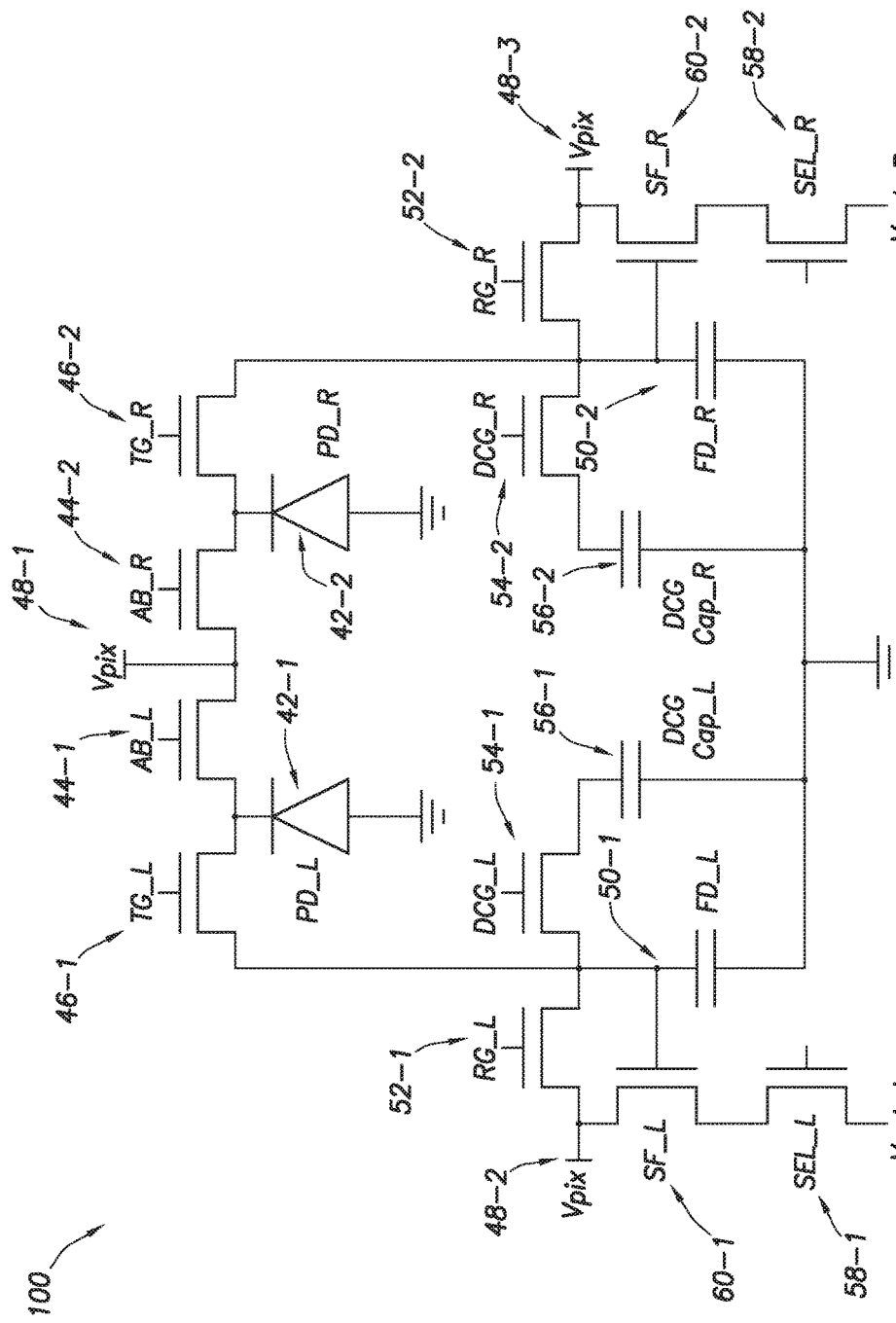
FIG. 7 is a circuit diagram of an illustrative phase detection pixel pair where each photodiode has a respective floating diffusion region in accordance with an embodiment of the present invention.

FIG. 7 is a circuit diagram of an illustrative phase detection pixel pair 100. As shown in FIG. 7, phase detection pixel pair 100 may include two photodiodes that each have respective floating diffusion regions. The first photodiode 42-1 may sometimes be referred to as the left photodiode (PD_L). The second photodiode 42-2 may sometimes be referred to as the right photodiode (PD_R). Each photodiode may be coupled to a respective transfer gate and anti-blooming gate. Photodiode 42-1 may be selectively coupled to bias voltage supply terminal 48-1 by anti-blooming transistor 44-1. When the anti-blooming transistor 44-1 (AB_L) is asserted, photodiode 42-1 may be coupled to bias voltage supply terminal 48-1, preventing charge from accumulating in the photodiode. Bias voltage supply terminal 48-1 may provide any desired bias voltage ($V_{pix}$). Transfer transistor 46-1 (TG_L) may couple photodiode 42-1 to floating diffusion region 50-1 (FD_L). When transfer transistor 46-1 is asserted, charge from photodiode 42-1 may be transferred to floating diffusion region 50-1.

Photodiode 42-2 may be selectively coupled to bias voltage supply terminal 48-1 by anti-blooming transistor 44-2. When the anti-blooming transistor 44-2 (AB_R) is asserted, photodiode 42-2 may be coupled to bias voltage supply terminal 48-1, preventing charge from accumulating in the photodiode. Transfer transistor 46-2 (TG_R) may couple photodiode 42-2 to floating diffusion region 50-2 (FD_R). When transfer transistor 46-2 is asserted, charge from photodiode 42-2 may be transferred to floating diffusion region 50-2. It should be noted that the embodiments of FIGS. 7 and 8 where bias voltage supply terminal 48-1 is shared between photodiodes 42-1 and 42-2 is merely illustrative. If desired, each photodiode may have a respective bias voltage supply terminal.

Each floating diffusion region may be coupled to a bias voltage supply terminal by a reset transistor. Each floating diffusion region may also be coupled to a dual conversion gain capacitor by a dual conversion gain transistor. Floating diffusion region 50-1 may be coupled to bias voltage supply terminal 48-2 by reset gate 52-1 (RG_L). Floating diffusion region 50-2 may be coupled to bias voltage supply terminal 48-3 by reset gate 52-2 (RG_R). Floating diffusion region 50-1 may be coupled to dual conversion gain capacitor 56-1 (DCG Cap_L) by dual conversion gain transistor 54-1 (DCG_L). Floating diffusion region 50-2 may be coupled to dual conversion gain capacitor 56-2 (DCG Cap_R) by dual conversion gain transistor 54-2 (DCG_R).

Each floating diffusion region may have corresponding readout circuitry. The signal associated with the stored charge on floating diffusion node 50-1 may be conveyed to row select transistor 58-1 (SEL_L) by source-follower transistor 60-1 (SF_L). The signal associated with the stored charge on floating diffusion node 50-2 may be conveyed to row select transistor 58-2 (SEL_R) by source-follower transistor 60-2 (SF_R). When signal SEL_L is asserted, transistor 58-1 turns on and a corresponding image signal $V_{OUT\_L}$ that is representative of the magnitude of the charge on shared charge storage node 50-1 is produced. When signal SEL_R is asserted, transistor 58-2 turns on and a corresponding image signal $V_{OUT\_R}$ that is representative of the magnitude of the charge on shared charge storage node 50-2 is produced.

Figure 8:
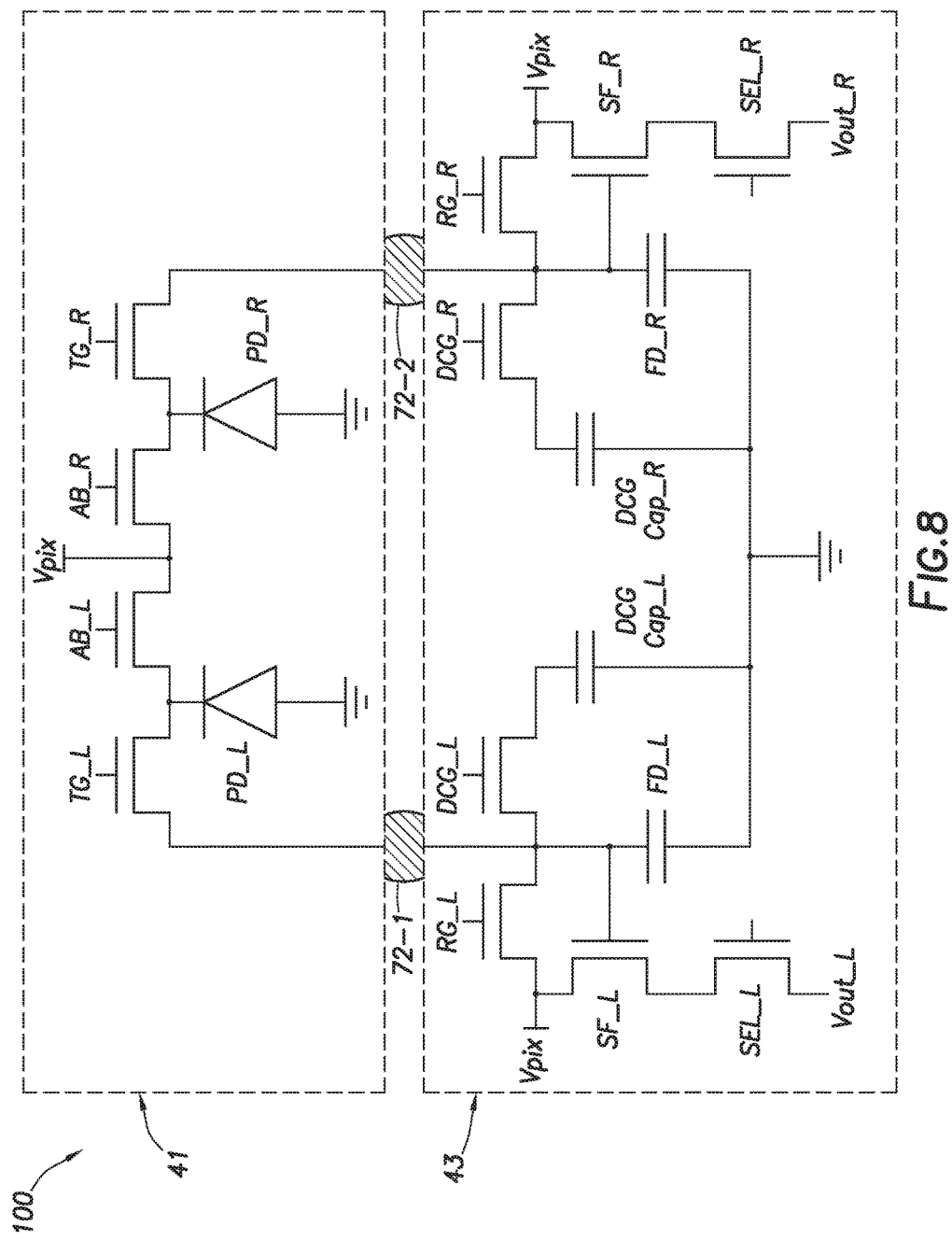
FIG. 8 is a circuit diagram of an illustrative phase detection pixel pair where each photodiode has a respective floating diffusion region and the pixels are split between multiple substrates in accordance with an embodiment of the present invention.

A phase detection pixel pair with a floating diffusion region for each photodiode may be implemented using stacked substrates as shown in FIG. 8. The pixel pair in FIG. 8 may be the same as the pixel pair in FIG. 7 except implemented in multiple substrates. Substrate 41 may include the photodiodes (PD_L and PD_R), the transfer transistors (TG_L and TG_R), and the anti-blooming transistors (AB_L and AB_R). Other pixel circuitry such as the floating diffusion regions (FD_L and FD_R), the reset transistors (RG_L and RG_R), the dual conversion gain transistors (DCG_L and DCG_R), the source follower transistors (SF_L and SF_R), and the row select transistors (SEL_L and SEL_R) may be formed in substrate 43. Substrates 41 and 43 may be coupled with interconnect layers 72. Interconnect layers 72 may be formed from a conductive material such as metal (e.g., copper). In certain embodiments, the interconnect layer may include solder. The interconnect layer may also be a through silicon via (TSV).

In FIG. 8, a first interconnect layer 72-1 is shown as being interposed between transfer gate TG_L and floating diffusion region FD_L and a second interconnect layer 72-2 is shown as being interposed between transfer gate TG_R and floating diffusion region FD_R. This example is merely illustrative and the interconnect layers may be interposed at any desired point within the pixel circuit (e.g., between the floating diffusion region and the source follower transistor, between the source follower transistor and the row select transistor, etc.). Additionally, in certain embodiments, interconnect layers may be formed at additional points within the circuit (e.g., between the floating diffusion region and the reset transistor, between the floating diffusion region and the dual conversion gain transistor, etc.). The circuitry associated with photodiode PD_L may be the same as the circuitry associated with PD_R (as shown in FIG. 8). Alternatively, if desired each photodiode may have different circuitry or interconnect layers implemented in different positions.

Figure 9:
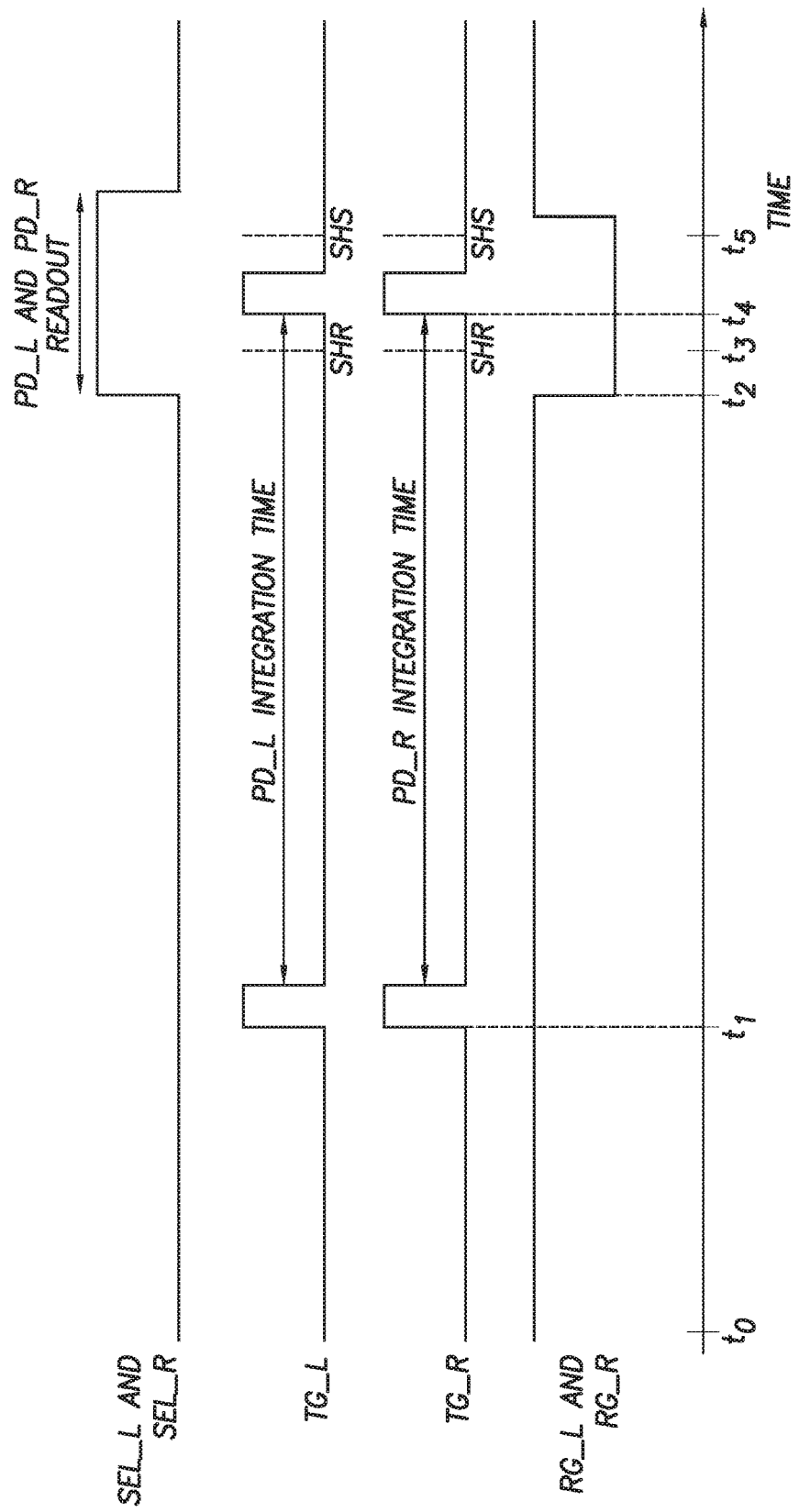
FIG. 9 is a timing diagram showing the operation of the phase detection pixel pair shown in FIG. 7 or FIG. 8 in accordance with an embodiment of the present invention.

FIG. 9 is a timing diagram showing the operation of phase detection pixel pair 100 from FIG. 7 or FIG. 8. As shown, at $t_0$ the reset transistors RG_L and RG_R may be asserted. Asserting reset transistor RG_L may reset floating diffusion 50-1 to a baseline value, and asserting reset transistor RG_R may reset floating diffusion 50-2 to a baseline value. At $t_1$, transfer transistors TG_L and TG_R may be asserted. Asserting transfer transistor TG_L (while reset transfer RG_L is asserted) may clear any accumulated charge from photodiode 42-1 (PD_L). Similarly, asserting transfer transistor TG_R (while reset transfer RG_R is asserted) may clear any accumulated charge from photodiode 42-2 (PD_R). After TG_L is asserted at $t_1$, charge may begin accumulating in PD_L during the PD_L integration time. After TG_R is asserted at $t_1$, charge may begin accumulating in PD_R during the PD_R integration time. At $t_2$, the reset transistor may be turned off, the row select transistors may be turned on, and the readout period for both photodiodes may begin. After RG_L and RG_R are deasserted, the reset level of floating diffusion regions FD_L and FD_R may be sampled at $t_3$ by asserting the sample and hold reset signal (SHR). Charge from PD_L may subsequently be transferred to floating diffusion region 50-1 by asserting TG_L at $t_4$. Simultaneously, charge from PD_R may be transferred to floating diffusion region 50-2 by asserting TG_R at $t_4$. The amount of charge in floating diffusion regions FD_L and FD_R may be sampled by asserting the sample and hold signal (SHS) at $t_5$.

FIG. 9 demonstrates how, by using a floating diffusion region for each photodiode instead of a shared floating diffusion region, the charge from each photodiode can be read out in parallel. This advantageously shortens the length of time required for readout. Including floating diffusion regions for each photodiode may have additional advantages such as added high dynamic range (HDR) functionality.

Figure 10:
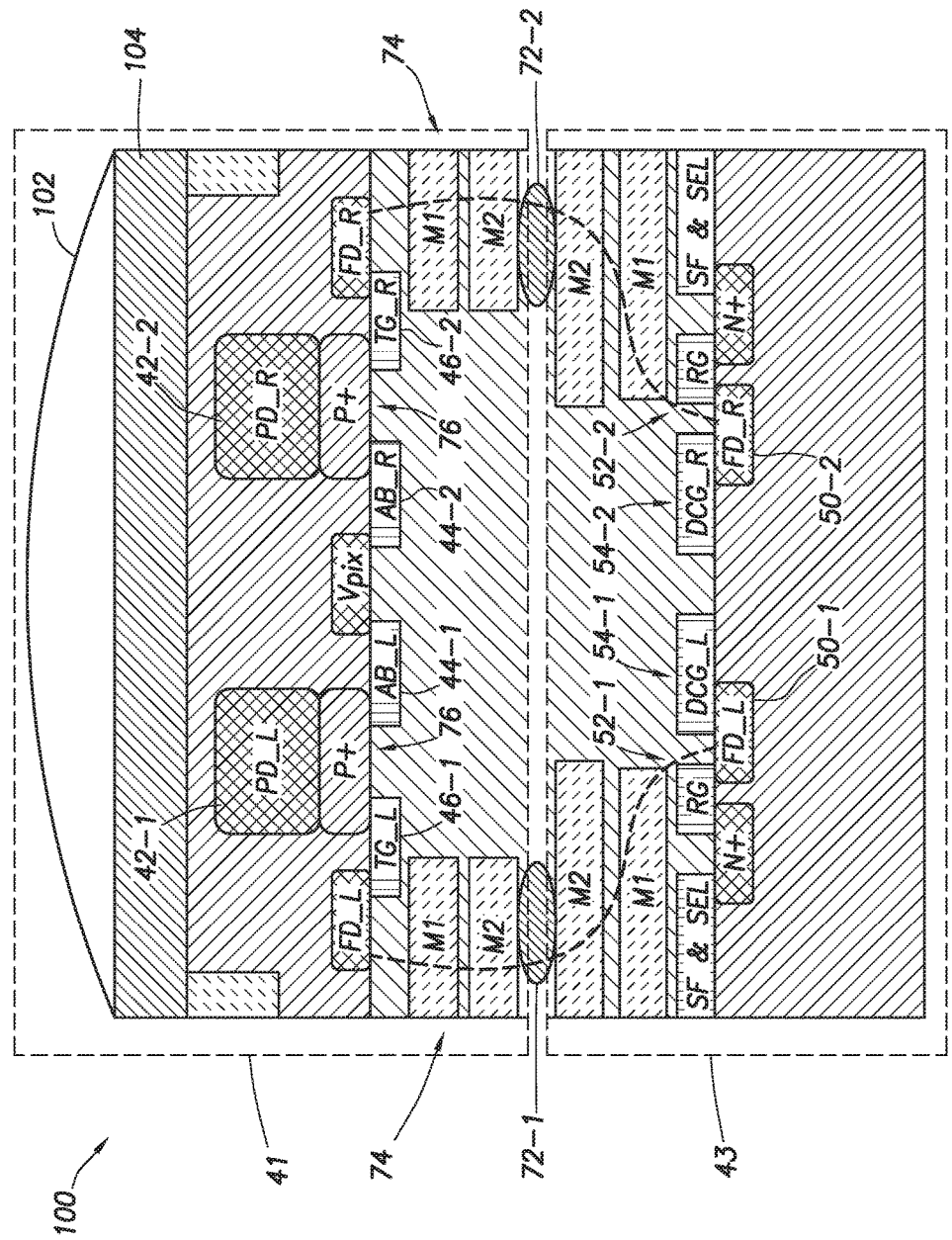
FIG. 10 is a cross-sectional side view of an illustrative phase detection pixel pair where each photodiode has a respective floating diffusion region in accordance with an embodiment of the present invention.

FIG. 10 is a cross-sectional side view of an illustrative phase detection pixel pair where each photodiode has a respective floating diffusion region and the pixels are implemented in stacked substrates. As shown in FIG. 10, phase detection pixel pair may include substrate 41 and substrate 43. Microlens 102 and color filter 104 may cover photodiodes 42-1 and 42-2. Similar to as shown in the circuit diagram of FIG. 8, interconnect layers 72-1 and 72-2 may connect the upper substrate to the lower substrate. Additional metal interconnect layers 74 may help form the connection between substrates.

P+ pinning layers 76 may be formed beneath each photodiode. Anti-blooming transistor 44-1 may be interposed between photodiode 42-1 and bias voltage region $V_{pix}$. Transfer transistor 46-1 may be interposed between photodiode 42-1 and floating diffusion region 50-1. As shown in FIG. 10, floating diffusion region 50-1 may include a first doped semiconductor region in substrate 41 and a second doped semiconductor region in substrate 43. When transfer transistor 46-1 is asserted charge from photodiode 42-1 may be transferred to FD_L in substrate 41 then travel along the dashed line through interconnect layer 72-1 to FD_L in substrate 43.

Anti-blooming transistor 44-2 may be interposed between photodiode 42-2 and bias voltage region $V_{pix}$. Transfer transistor 46-2 may be interposed between photodiode 42-2 and floating diffusion region 50-2. As shown in FIG. 10, floating diffusion region 50-2 may include a first doped semiconductor region in substrate 41 and a second doped semiconductor region in substrate 43. When transfer transistor 46-2 is asserted charge from photodiode 42-2 may be transferred to FD_R in substrate 41 then travel along the dashed line through interconnect layer 72-2 to FD_R in substrate 43.

Reset transistor 52-1 may couple floating diffusion region 50-1 to a doped semiconductor region (N+) that is coupled to a bias voltage ($V_{PIX}$). Reset transistor 52-2 may couple floating diffusion region 50-2 to a doped semiconductor region (N+) that is coupled to a bias voltage ($V_{PIX}$). Dual conversion gain transistor 54-1 may couple floating diffusion region 50-1 to a capacitor, and dual conversion gain transistor 54-2 may couple floating diffusion region 50-2 to a capacitor.

Figure 11:
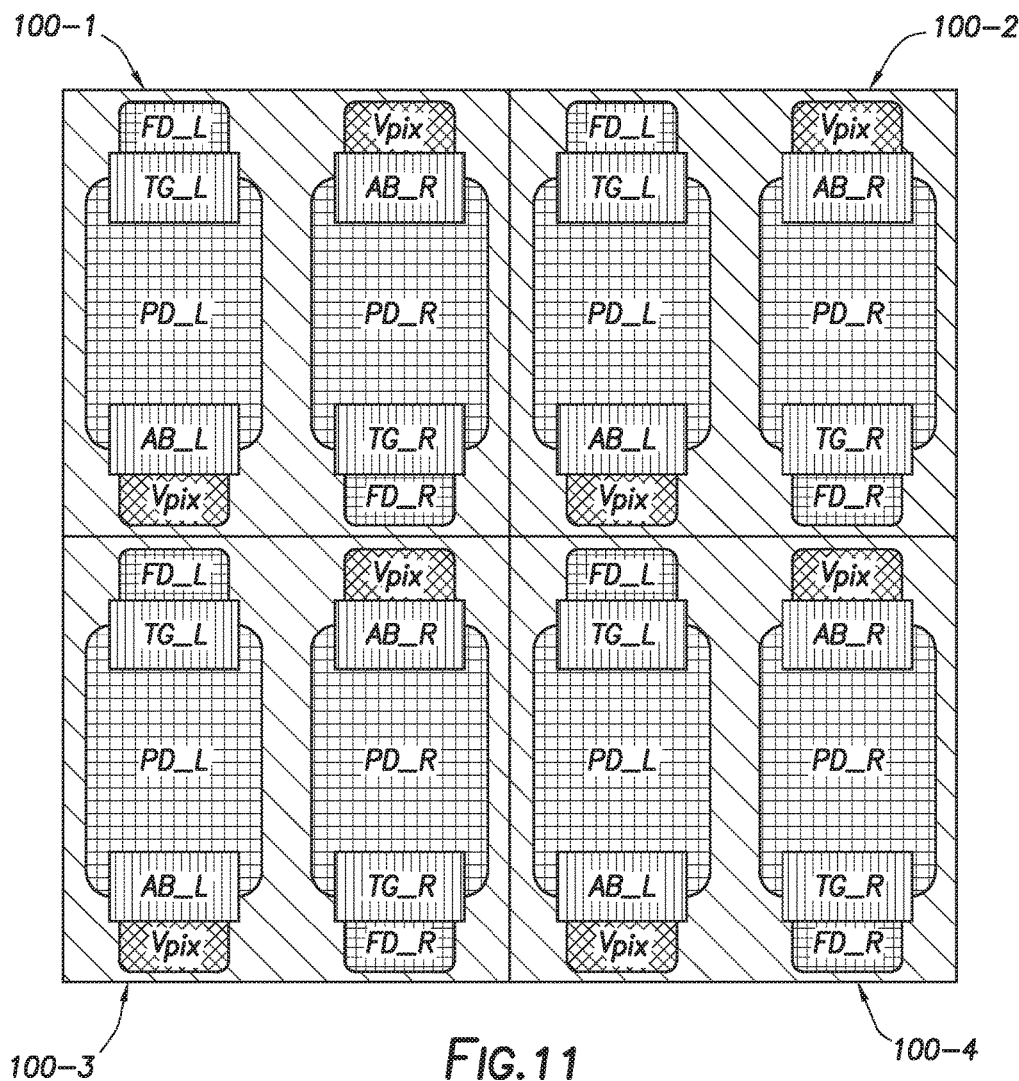
FIG. 11 is a top view of illustrative phase detection pixel pairs where each photodiode has a respective floating diffusion region in accordance with an embodiment of the present invention.

In order to avoid leakage of charge between floating diffusion regions, the floating diffusion regions may be arranged as shown in FIG. 11. FIG. 11 is a top view of illustrative phase detection pixel pairs with floating diffusion regions for each photodiode. Phase detection pixel pairs 100-1, 100-2, 100-3, and 100-4 each include first and second photodiodes (PD_L and PD_R).

Each photodiode may have a transfer transistor coupled between the photodiode and a floating diffusion region and an anti-blooming transistor coupled between the photodiode and a bias voltage ($V_{PIX}$). To distance the floating diffusion regions (and corresponding interconnect layers) from each other, the floating diffusion regions may be formed on opposing sides of their respective photodiodes. For example, PD_L and PD_R of phase detection pixel pair 100-1 may have first and second opposing sides. The first side of the first photodiode may be adjacent to the first side of the second photodiode, and the second side of the first photodiode may be adjacent to the second side of the second photodiode. Transfer transistor TG_L and floating diffusion region FD_L may be formed on the first side of photodiode PD_L whereas transfer transistor TG_R and floating diffusion region FD_R may be formed on the second side of photodiode PD_R. Similarly, anti-blooming transistor AB_L and the bias voltage region of PD_L may be formed on the second side of PD_L whereas anti-blooming transistor AB_R and the bias voltage region of PD_R may be formed on the first side of PD_R. TG_L and AB_R may be adjacent on the first side of the phase detection pixel pair whereas TG_R and AB_L may be adjacent on the second side of the phase detection pixel pair. This way, FD_L and FD_R are on opposing corners of the phase detection pixel pair, reducing the likelihood of charge leaking between FD_L and FD_R and maximizing distance between interconnect layers. This pattern may be repeated in each phase detection pixel pair to ensure reduced leakage between floating diffusion regions across the array.

Figures 12A, 12B:
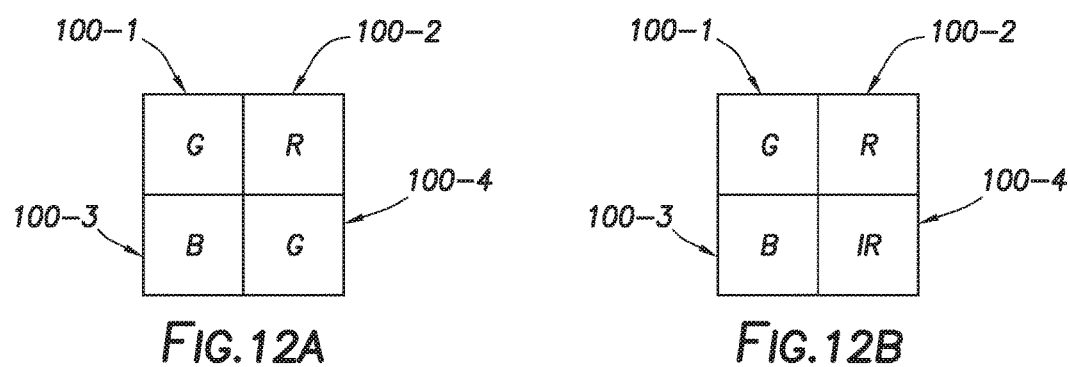
FIGS. 12A and 12B are top views of illustrative color filter patterns that may be used to cover phase detection pixel pairs in accordance with an embodiment of the present invention.

FIGS. 12A and 12B show illustrative color filter patterns that may be used to cover phase detection pixel pairs. FIG. 12A shows color filter elements arranged in a Bayer mosaic pattern. The Bayer Mosaic pattern consists of a repeating cell of two-by-two color filter elements, with two green color filter elements diagonally opposite one another, and the other corners being red and blue. In FIG. 12A, red color filter elements are labeled "R", green color filter elements are labeled "G", and blue color filter elements are labeled "B". Each color filter element may cover a corresponding phase detection pixel pair.

In FIG. 12B, the color filter pattern may be similar to the Bayer Mosaic pattern, except with an infrared color filter replacing one of the green color filters. In FIG. 12B, red color filter elements are labeled "R", green color filter elements are labeled "G", blue color filter elements are labeled "B", and infrared color filter elements are labeled "IR". In general, any desired color filter pattern may be used to cover the phase detection pixel pairs.

In various embodiments, an image sensor may include a first photodiode, a second photodiode adjacent to the first photodiode, a microlens that covers the first photodiode and the second photodiode, a first floating diffusion region, a second floating diffusion region, a first transfer transistor configured to transfer charge from the first photodiode to the first floating diffusion region, and a second transfer transistor configured to transfer charge from the second photodiode to the second floating diffusion region. The second transfer transistor may be configured to transfer charge from the second photodiode to the second floating diffusion region at the same time as the first transfer transistor transfers charge from the first photodiode to the first floating diffusion region.

The image sensor may also include a bias voltage supply terminal, a first anti-blooming transistor that is interposed between the first photodiode and the bias voltage supply terminal, and a second anti-blooming transistor that is coupled between the second photodiode and the bias voltage supply terminal. The image sensor may also include a first reset transistor coupled between the first floating diffusion region and a first bias voltage supply terminal, and a second reset transistor coupled between the second floating diffusion region and a second bias voltage supply terminal. The image sensor may also include a first source follower transistor coupled to the first floating diffusion region, a first row select transistor coupled to the first source follower transistor, a second source follower transistor coupled to the second floating diffusion region, and a second row select transistor coupled to the second source follower transistor.

The image sensor may also include a first capacitor, a second capacitor, a first dual conversion gain transistor interposed between the first floating diffusion region and the first capacitor, and a second dual conversion gain transistor coupled between the second floating diffusion region and the second capacitor. The first photodiode, the second photodiode, the first transfer transistor, and the second transfer transistor may be formed in a first substrate, the first floating diffusion region, the second floating diffusion region, the first source follower transistor, and the second source follower transistor may be formed in a second substrate, and the first and second substrates may be connected by a metal interconnect layer. The metal interconnect layer may include a first metal interconnect layer interposed between the first transfer transistor and the first floating diffusion region and the metal interconnect layer may include a second metal interconnect layer interposed between the second transfer transistor and the second floating diffusion region.

The first photodiode may have first and second opposing sides, the second photodiode may have first and second opposing sides, the first floating diffusion region may be formed on the first side of the first photodiode, and the second floating diffusion region may be formed on the second side of the second photodiode. The first transfer transistor may be formed on the first side of the first photodiode between the first photodiode and the first floating diffusion region, the second transfer transistor may be formed on the second side of the second photodiode between the second photodiode and the second floating diffusion region, a first anti-blooming transistor may be formed on the second side of the first photodiode adjacent to the second transfer transistor, and a second anti-blooming transistor may be formed on the first side of the second photodiode adjacent to the first transfer transistor.

In various embodiments, a method for operating an image sensor with first and second photodiodes covered by a single microlens, first and second floating diffusion regions, a first transfer transistor that couples the first photodiode to the first floating diffusion region, and a second transfer transistor that couples the second photodiode to the second floating diffusion region may include asserting the first transfer transistor to transfer charge from the first photodiode to the first floating diffusion region and asserting the second transfer transistor to transfer charge from the second photodiode to the second floating diffusion region while asserting the first transfer transistor. The first floating diffusion region may be coupled to a first bias voltage supply terminal by a first reset transistor and the second floating diffusion region may be coupled to a second bias voltage supply terminal by a second reset transistor. The method may also include asserting the first reset transistor to reset the first floating diffusion region before asserting the first transfer transistor to transfer charge from the first photodiode to the first floating diffusion region and asserting the second reset transistor to reset the second floating diffusion region before asserting the second transfer transistor to transfer charge from the second photodiode to the second floating diffusion region.

The method may also include sampling a reset level of the first floating diffusion region after asserting the first reset transistor to reset the first floating diffusion region and before asserting the first transfer transistor to transfer charge from the first photodiode to the first floating diffusion region and sampling a reset level of the second floating diffusion region after asserting the second reset transistor to reset the second floating diffusion region and before asserting the second transfer transistor to transfer charge from the second photodiode to the second floating diffusion region.

The method may also include sampling a voltage level of the first floating diffusion region after asserting the first transfer transistor to transfer charge from the first photodiode to the first floating diffusion region and sampling a voltage level of the second floating diffusion region after asserting the second transfer transistor to transfer charge from the second photodiode to the second floating diffusion region. The method may also include subtracting the reset level of the first floating diffusion region from the voltage level of the first floating diffusion region and subtracting the reset level of the second floating diffusion region from the voltage level of the second floating diffusion region. The method may also include asserting the first transfer transistor to reset the first photodiode and asserting the second transfer transistor to reset the second photodiode while asserting the first reset transistor and while asserting the second reset transistor.

In various embodiments, an image sensor may include a first substrate, a second substrate, a first photodiode formed in the first substrate, a second photodiode formed in the second substrate, a microlens that covers the first photodiode and the second photodiode, a first floating diffusion region with a first portion formed in the first substrate and a second portion formed in the second substrate, a second floating diffusion region with a first portion formed in the first substrate and a second portion formed in the second substrate, a first transfer transistor formed between the first portion of the first floating diffusion region and the first photodiode, a second transfer transistor formed between the first portion of the second floating diffusion region and the second photodiode, a first metal interconnect layer that couples the first portion of the first floating diffusion region to the second portion of the first floating diffusion region, and a second metal interconnect layer that couples the first portion of the second floating diffusion region to the second portion of the second floating diffusion region.

The first photodiode may have first and second opposing sides, the second photodiode may have first and second opposing sides, the first side of the first photodiode may be adjacent the first side of the second photodiode, the second side of the first photodiode may be adjacent the second side of the second photodiode, the first transfer transistor may be formed on the first side of the first photodiode, and the second transfer transistor may be formed on the second side of the second photodiode. The image sensor may also include a first anti-blooming transistor that is formed in the first substrate on the second side of the first photodiode and a second anti-blooming transistor that is formed in the first substrate on the first side of the second photodiode.

The image sensor may also include a first source follower transistor in the second substrate that is coupled to the first floating diffusion region, a first row select transistor in the second substrate that is coupled to the first source follower transistor, a second source follower transistor in the second substrate that is coupled to the second floating diffusion region, a second row select transistor in the second substrate that is coupled to the second source follower transistor, a first capacitor in the second substrate, a second capacitor in the second substrate, a first dual conversion gain transistor in the second substrate that is interposed between the first floating diffusion region and the first capacitor, and a second dual conversion gain transistor in the second substrate that is coupled between the second floating diffusion region and the second capacitor.

The foregoing is merely illustrative of the principles of this invention and various modifications can be made by those skilled in the art. The foregoing embodiments may be implemented individually or in any combination.

What is claimed is:
1. An image sensor comprising:
   a first photodiode;
   a second photodiode adjacent to the first photodiode, wherein the first and second photodiodes have first and second opposing sides;
   a microlens that covers the first photodiode and the second photodiode;
   a first floating diffusion region, wherein the first floating diffusion region is formed on the first side of the first and second photodiodes;

a second floating diffusion region, wherein the second floating diffusion region is formed on the second side of the first and second photodiodes;

a first transfer transistor configured to transfer charge from the first photodiode to the first floating diffusion region; and a second transfer transistor configured to transfer charge from the second photodiode to the second floating diffusion region.

2. The image sensor defined in claim 1, wherein the second transfer transistor is configured to transfer charge from the second photodiode to the second floating diffusion region at the same time as the first transfer transistor transfers charge from the first photodiode to the first floating diffusion region.

3. The image sensor defined in claim 1, further comprising:
   a bias voltage supply terminal;
   a first anti-blooming transistor that is interposed between the first photodiode and the bias voltage supply terminal; and
   a second anti-blooming transistor that is coupled between the second photodiode and the bias voltage supply terminal.

4. The image sensor defined in claim 1, further comprising:
   a first reset transistor coupled between the first floating diffusion region and a first bias voltage supply terminal; and
   a second reset transistor coupled between the second floating diffusion region and a second bias voltage supply terminal.

5. The image sensor defined in claim 4, further comprising:
   a first source follower transistor coupled to the first floating diffusion region;
   a first row select transistor coupled to the first source follower transistor;
   a second source follower transistor coupled to the second floating diffusion region; and
   a second row select transistor coupled to the second source follower transistor.

6. The image sensor defined in claim 5, further comprising:
   a first capacitor;
   a second capacitor;
   a first dual conversion gain transistor interposed between the first floating diffusion region and the first capacitor; and
   a second dual conversion gain transistor coupled between the second floating diffusion region and the second capacitor.

7. The image sensor defined in claim 6, wherein the first photodiode, the second photodiode, the first transfer transistor, and the second transfer transistor are formed in a first substrate, wherein the first floating diffusion region, the second floating diffusion region, the first source follower transistor, and the second source follower transistor are formed in a second substrate, and wherein the first and second substrates are connected by a metal interconnect layer.

8. The image sensor defined in claim 7, wherein the metal interconnect layer comprises a first metal interconnect layer interposed between the first transfer transistor and the first floating diffusion region and wherein the metal interconnect layer comprises a second metal interconnect layer interposed between the second transfer transistor and the second floating diffusion region.

9. The image sensor defined in claim 1, wherein the first transfer transistor is formed on the first side of the first and second photodiodes between the first photodiode and the first floating diffusion region, wherein the second transfer transistor is formed on the second side of the first and second photodiodes between the second photodiode and the second floating diffusion region, wherein a first anti-blooming transistor is formed on the second side of the first and second photodiodes adjacent to the second transfer transistor, and wherein a second anti-blooming transistor is formed on the first side of the first and second photodiodes adjacent to the first transfer transistor.

10. An image sensor comprising:
    a first substrate;
    a second substrate;
    a first photodiode formed in the first substrate;
    a second photodiode formed in the second substrate;
    a microlens that covers the first photodiode and the second photodiode;
    a first floating diffusion region with a first portion formed in the first substrate and a second portion formed in the second substrate;
    a second floating diffusion region with a first portion formed in the first substrate and a second portion formed in the second substrate;
    a first transfer transistor formed between the first portion of the first floating diffusion region and the first photodiode;
    a second transfer transistor formed between the first portion of the second floating diffusion region and the second photodiode;
    a first metal interconnect layer that couples the first portion of the first floating diffusion region to the second portion of the first floating diffusion region; and
    a second metal interconnect layer that couples the first portion of the second floating diffusion region to the second portion of the second floating diffusion region.

11. The image sensor defined in claim 10, wherein the first photodiode has first and second opposing sides, wherein the second photodiode has first and second opposing sides, wherein the first side of the first photodiode is adjacent the first side of the second photodiode, wherein the second side of the first photodiode is adjacent the second side of the second photodiode, wherein the first transfer transistor is formed on the first side of the first photodiode, and wherein the second transfer transistor is formed on the second side of the second photodiode.

12. The image sensor defined in claim 11, further comprising:
    a first anti-blooming transistor that is formed in the first substrate on the second side of the first photodiode; and
    a second anti-blooming transistor that is formed in the first substrate on the first side of the second photodiode.

13. The image sensor defined in claim 12, further comprising:
    a first source follower transistor in the second substrate that is coupled to the first floating diffusion region;
    a first row select transistor in the second substrate that is coupled to the first source follower transistor;
    a second source follower transistor in the second substrate that is coupled to the second floating diffusion region;
    a second row select transistor in the second substrate that is coupled to the second source follower transistor;
    a first capacitor in the second substrate;

a second capacitor in the second substrate;
a first dual conversion gain transistor in the second substrate that is interposed between the first floating diffusion region and the first capacitor; and
a second dual conversion gain transistor in the second substrate that is coupled between the second floating diffusion region and the second capacitor.

14. An image sensor comprising:
a first photodiode;
a second photodiode adjacent to the first photodiode, wherein the first and second photodiodes have first and second opposing sides;
a microlens that covers the first photodiode and the second photodiode;
a first floating diffusion region;
a second floating diffusion region;
a first transfer transistor configured to transfer charge from the first photodiode to the first floating diffusion region;
a second transfer transistor configured to transfer charge from the second photodiode to the second floating diffusion region;
a first anti-blooming transistor that is formed on the second side of the first and second photodiodes; and
a second anti-blooming transistor that is formed on the first side of the first and second photodiodes.

* * * * *